(12) United States Patent
Lee et al.

(10) Patent No.: US 10,134,902 B2
(45) Date of Patent: Nov. 20, 2018

(54) PMOS FINFET

(71) Applicant: Taiwan Semiconductor Manufacturing Co., Ltd., Hsinchu (TW)

(72) Inventors: Wei-Yang Lee, Taipei (TW); Chia-Chun Lan, Tainan (TW); Chia-Ling Chan, Taipei (TW); Feng-Cheng Yang, Zhudong Township (TW); Yen-Ming Chen, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/460,006

(22) Filed: Mar. 15, 2017

(65) Prior Publication Data

US 2018/0175200 A1 Jun. 21, 2018

Related U.S. Application Data

(60) Provisional application No. 62/435,014, filed on Dec. 15, 2016.

(51) Int. Cl.
| | |
|---|---|
| *H01L 21/70* | (2006.01) |
| *H01L 29/78* | (2006.01) |
| *H01L 29/161* | (2006.01) |
| *H01L 29/08* | (2006.01) |
| *H01L 29/167* | (2006.01) |
| *H01L 29/66* | (2006.01) |
| *H01L 21/311* | (2006.01) |
| *H01L 27/092* | (2006.01) |

(52) U.S. Cl.
CPC .... *H01L 29/7851* (2013.01); *H01L 21/31111* (2013.01); *H01L 27/0924* (2013.01); *H01L 29/0847* (2013.01); *H01L 29/161* (2013.01); *H01L 29/167* (2013.01); *H01L 29/66803* (2013.01)

(58) Field of Classification Search
CPC .......... H01L 29/7851; H01L 21/31111; H01L 27/0924; H01L 29/0847; H01L 29/161; H01L 29/167; H01L 29/66803; H01L 21/823431; H01L 21/845; H01L 27/10879; H01L 27/1211; H01L 29/41791; H01L 29/66795; H01L 29/7831; H01L 2029/7858; H01L 29/786
USPC ......... 257/288, 368, 369; 438/151, 197, 199
See application file for complete search history.

(56) References Cited

U.S. PATENT DOCUMENTS

| | | | |
|---|---|---|---|
| 7,534,669 B2 | 5/2009 | Anderson et al. | |
| 8,728,332 B2 | 5/2014 | Lin et al. | |
| 8,796,666 B1 | 8/2014 | Huang et al. | |
| 8,822,243 B2 | 9/2014 | Yan et al. | |
| 8,987,142 B2 | 3/2015 | Lee et al. | |
| 9,093,530 B2 | 4/2015 | Huang et al. | |

(Continued)

*Primary Examiner* — Shahed Ahmed
(74) *Attorney, Agent, or Firm* — Haynes and Boone, LLP (57) ABSTRACT

A system is configured to perform plasma related fabrication processes. The system includes a process chamber and a wafer stage positioned within the process chamber. The wafer stage is configured to secure a process wafer. The system further includes a bottom electrode positioned beneath the wafer stage, a top electrode positioned external to the chamber, and a plasma distribution mechanism. The plasma distribution mechanism is reconfigurable to allow for more than one plasma distribution profile.

20 Claims, 7 Drawing Sheets

(56) References Cited

U.S. PATENT DOCUMENTS

| | | | |
|---|---|---|---|
| 9,053,279 B2 | 6/2015 | Chang et al. | |
| 9,099,530 B2 | 8/2015 | Lin et al. | |
| 9,123,566 B2 | 9/2015 | Mitard et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 9,613,868 B2 | 4/2017 | Yu | |
| 2010/0237436 A1* | 9/2010 | Inaba | H01L 27/0886 257/392 |
| 2015/0014776 A1* | 1/2015 | Akarvardar | H01L 21/823431 257/368 |
| 2015/0287807 A1* | 10/2015 | Lee | H01L 29/66545 438/285 |
| 2017/0125419 A1* | 5/2017 | Jan | H01L 27/0924 |

* cited by examiner

PMOS FINFET

PRIORITY INFORMATION

This application claims the benefit of U.S. Provisional Application No. 62/435,014 filed Dec. 15, 2016, and entitled "Improved PMOS FinFET," the disclosure of which is hereby incorporated by reference in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One type of semiconductor device that can be fabricated is a Fin Field Effect Transistor (FinFET). In a FinFET, a fin-shaped semiconductor structure is formed on a substrate. A gate device that wraps around the fin structure can then be formed. Additionally, active regions such as source/drain regions are then formed within the fin structure adjacent the gate structure. The gate device and adjacent source/drain regions thus form a transistor with the channel extending through the fin structure underneath the gate. FinFET devices include both p-type (PMOS) transistors and n-type (NMOS) transistors. PMOS devices utilize holes as charge carries while NMOS devices utilize electrons as charge carriers. Due to the characteristic different between PMOS and NMOS transistors, there are different design considerations for each type of transistor. It is desirable to improve the efficiency and performance of finFET transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to improve the efficiency and performance of finFET transistors. According to the present example, a PMOS finFET device includes a fin structure disposed on a semiconductor substrate. The fin structure includes a fin sidewall that is partially removed so as to expose the upper portion of the fin. The fin structure further includes source/drain features that are formed into the fin structure. The source/drain features extend about halfway through the height of the fin structure. Additionally, the top portion of the fin sidewall corresponds with the bottom surface of the source/drain features. Both the fin structure and the source/drain regions may include silicon germanium that is doped with a p-type dopant such as boron. The source/drain regions may have a higher concentration of germanium than the channel regions.

Figure 1A:
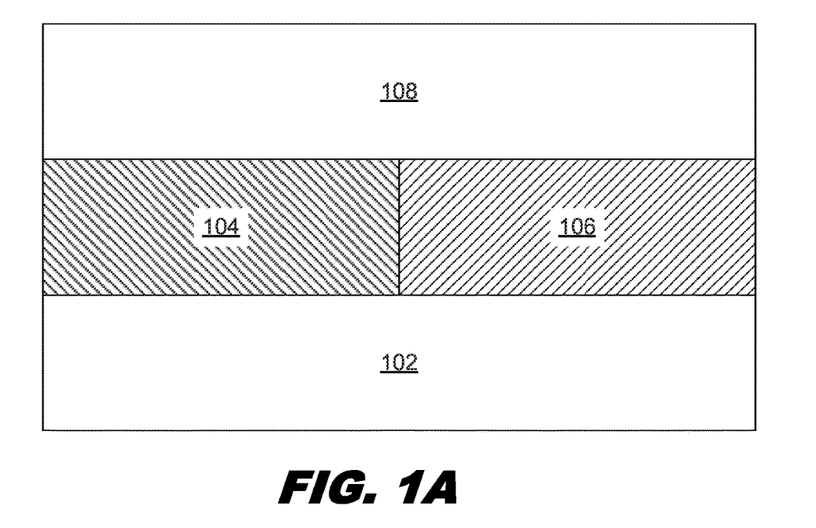
FIGS. 1A, 1B, 1C, 1D, 1E, 1F, 1G, 1H, 1I, and 1J are diagrams showing an illustrative process for forming an improved PMOS FinFET device, according to one example of principles described herein.

FIGS. 1A, 1B, 1C, 1D, 1E, 1F, 1G, and 1H are diagrams showing an illustrative process for forming an improved PMOS FinFET device. FIG. 1A illustrates a substrate 102 with an n-well 104 and a p-well 106 formed therein. A semiconductor layer 108 is disposed on top of the n-well 104 and the p-well 106.

The substrate 102 may be a semiconductor wafer comprising silicon. The semiconductor wafer may be a standard wafer used in semiconductor fabrication processes. For example, the semiconductor wafer may be a round wafer having a diameter of about 300 millimeters.

The n-well 104 and the p-well 106 may be formed by doping the semiconductor with the appropriate type of dopant. For example, to form the n-well, the portions of the semiconductor substrate that are to be p-wells are covered by a mask such as an oxide material. Then, a doping process such as an implanting process can be applied to the exposed portions of the semiconductor substrate. The n-well may be doped with an n-type dopant such as Arsenic.

After the n-well regions 104 are formed, the n-well regions may be covered with a mask material that is then patterned to expose the portions of the substrate where the p-wells 106 are to be formed. Then, a doping process such as an implanting process may be used to dope the exposed portions of the semiconductor substrate 102 with a p-type dopant such as boron. In some examples, the p-wells 106 may be formed before the n-wells.

The semiconductor layer 108 may be formed by use of an epitaxial growth process. An epitaxial growth process is one in which semiconductor material is provided through a carrier gas and is deposited in a crystal structure onto the underlying crystal substrate. Thus, the semiconductor layer gets deposited onto the semiconductor n-wells 104 and p-wells 106. In one example, the semiconductor layer 108 may be silicon. The semiconductor layer 108 may be selected for use as a fin structure for an NMOS device. Thus, the semiconductor layer 108 may also be referred to as an NMOS semiconductor layer 108.

Figure 1B:
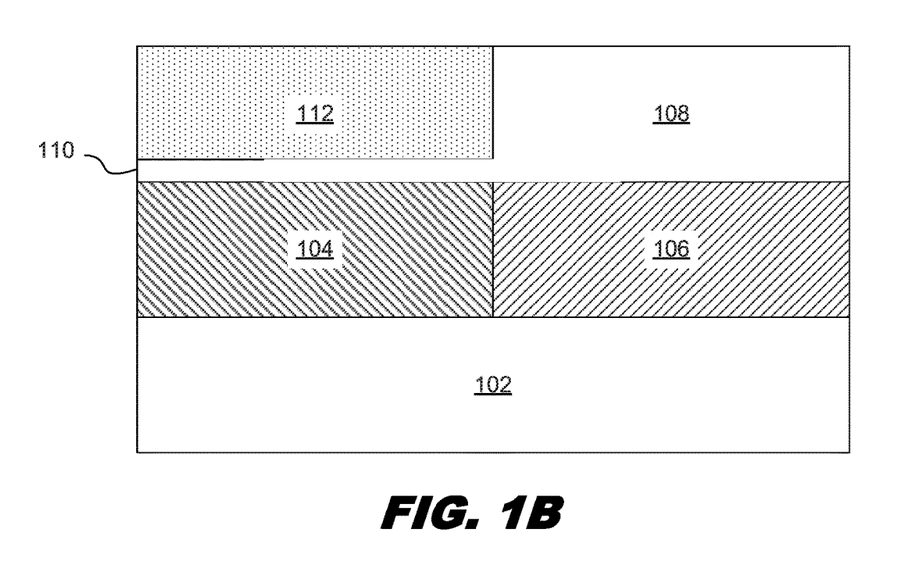

FIG. 1B illustrates the portions of the semiconductor layer 108 over the n-wells 104 removed and replaced with a semiconductor layer 112 selected for use in the fin structure of a PMOS device. Thus, the semiconductor layer 112 may also be referred to as a PMOS semiconductor layer 112.

To form the PMOS semiconductor layer 112, the portions of the NMOS semiconductor layer 108 that are over the p-wells 106 are covered with a mask layer. The mask layer is patterned to expose the regions over the n-wells 104. Then an etching process is applied to remove the semiconductor layer 108 that is exposed through the mask. In some examples, and as illustrated, the semiconductor layer 108 is not entirely removed. Instead, a small, thin layer is left remaining to be a seed layer 110. The seed layer 110 may reduce the number of defects that are present in the PMOS semiconductor layer 112. The PMOS semiconductor layer 112 may be formed through an epitaxial growth process. In some examples, a Chemical Mechanical Planarization (CMP) process may be used to planarize the top surface of the PMOS semiconductor layer 112 and the NMOS semiconductor layer 108. A CMP process includes a mechanical component and a chemical component. The mechanical component involves abrasive particles and the chemical component involves a chemical etchant.

In one example, the PMOS semiconductor layer 112 may include silicon germanium (SiGe). Other types of semiconductor materials that are well-suited for PMOS transistors may be used. The silicon germanium may have a concentration of germanium within a range of about 25 to 40%.

Figure 1C:
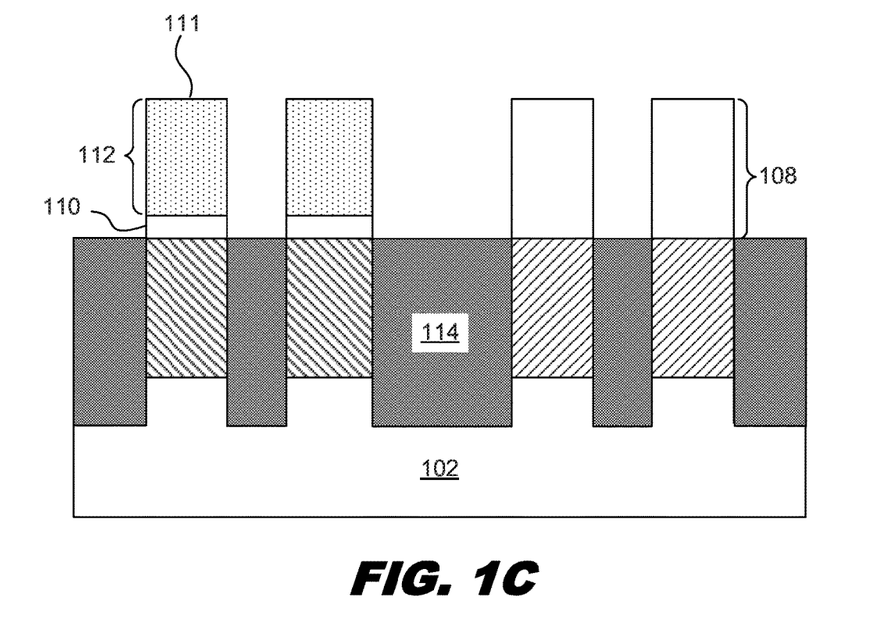

FIG. 1C illustrates formation of the fin structures and Shallow Trench Isolation (STI) structures. To form the fin structures, the substrate is patterned using photolithographic techniques. For example, a photoresist material may be deposited and patterned. Patterning the photoresist may be done by exposing the deposited photoresist to a light source through a mask. The photoresist layer may then be developed to expose regions that are to be etched. An etching process is then applied to remove portions of the substrate to form the fin structures 111 as shown.

After the fin structures are formed, STI structures 114 may be formed between the fin structures 111. This may be done by depositing a dielectric material and etching that material to the desired height. The dielectric material and the material of the fin structures may be selected so that the dielectric material of the STI structures can be removed while leaving the fin structures 111 substantially intact.

Figure 1D:
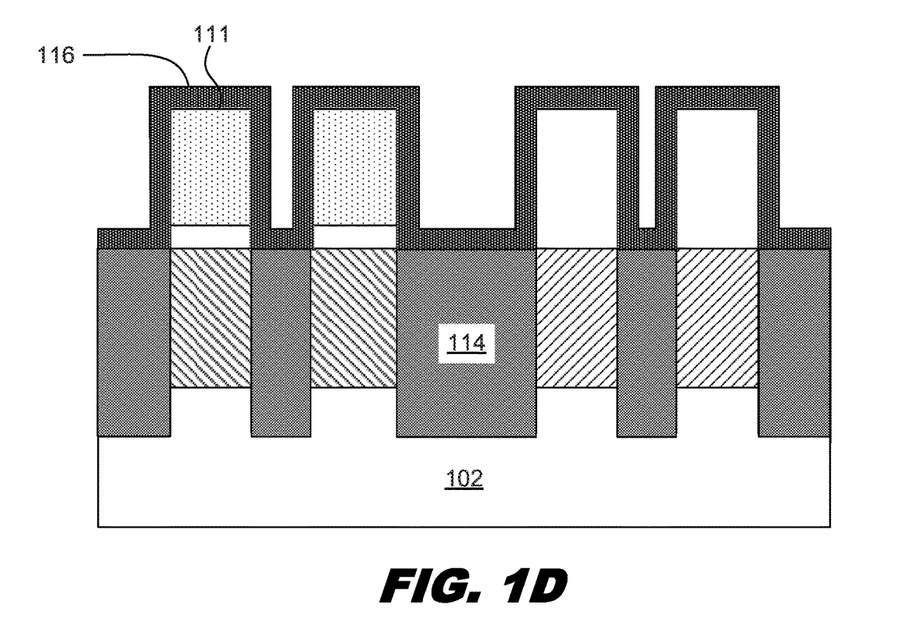

FIG. 1D illustrates deposition of a fin sidewall 116. The fin sidewall 116 may be deposited through use of a deposition process such as a Chemical Vapor Deposition (CVD) process. Other deposition processes may be used to deposit the fin sidewall 116. The fin sidewall 116 may include a dielectric material such as a nitride material.

Figure 1E:
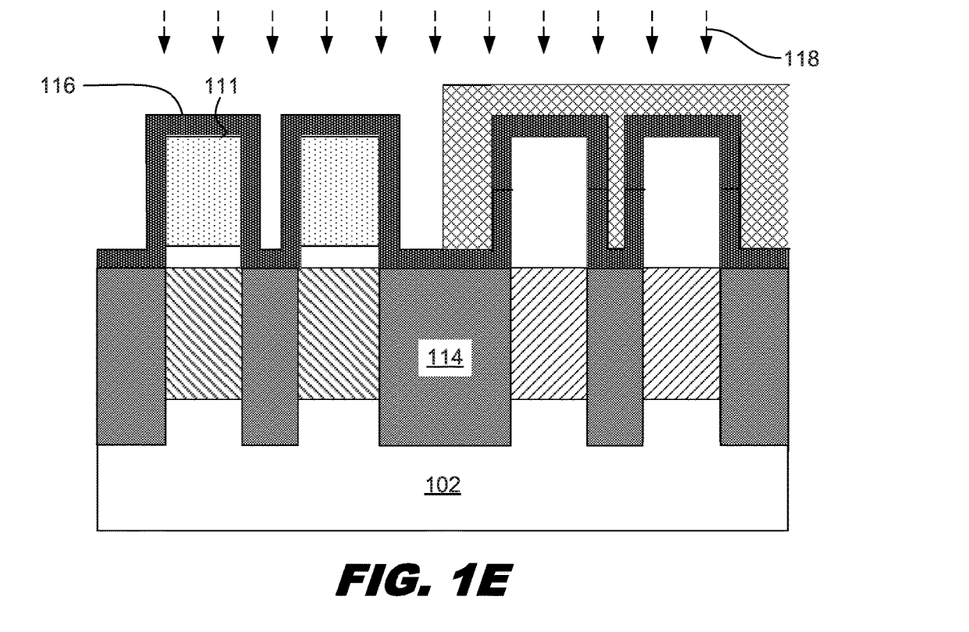

FIG. 1E illustrates a doping process 118 to dope the PMOS fin structures 111 with a p-type dopant such as boron. Before the doping process 118 is applied, the NMOS features may be covered. The doping process 118 also introduces the p-type dopant into the fin sidewall 116. In some examples, the doping process 118 may be a plasma doping process. A plasma doping process involves using a high voltage direct current (DC) to extract ions from plasma and inject them into a target. For example, a plasma gas may include p-type dopants such as boron. Such a plasma gas may then be introduced into a chamber that also includes the substrate. An electromagnetic field can then be applied to direct ions from the plasma into the surface.

Figure 1F:
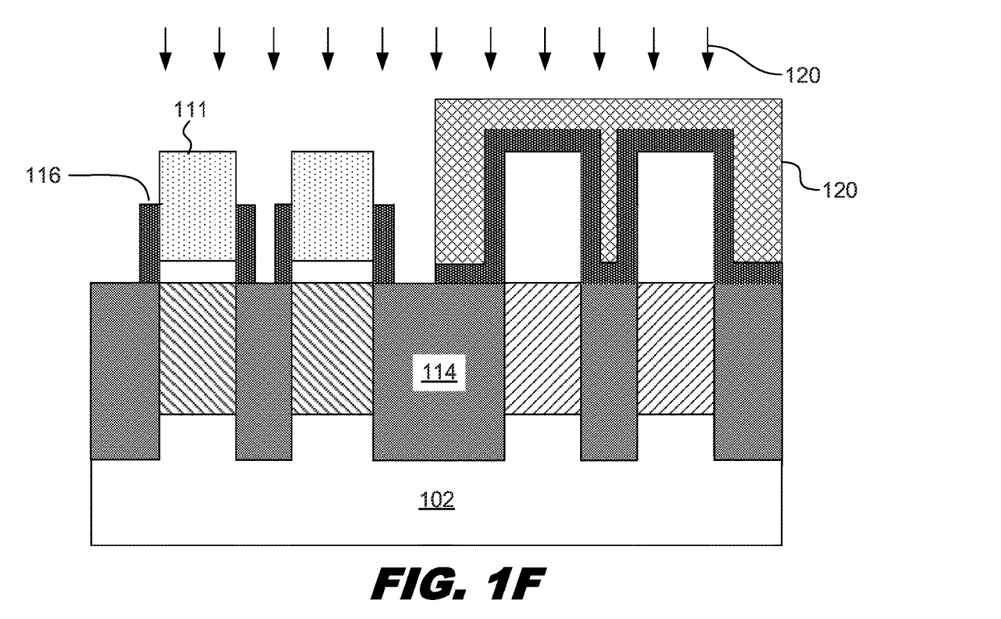

FIG. 1F illustrates an etching process 120 to remove the fin sidewall from an upper portion of the PMOS fin structures 111. The etching process may be an anisotropic process such as a dry etching process. A dry etching process involves directing ions at a substrate to remove material from that substrate. A dry etching process can be selective so as to remove some type of materials while leaving other types of materials substantially intact. Thus, the etching process 120 can remove the fin sidewalls 116 while leaving the PMOS fin structures 111 substantially intact. The etching process 120 may be applied until the top surfaces of the fin sidewalls are at a point that is within the middle of the height of the fin structures 111. In some examples, the etching process 120 may be applied until the top surfaces of the fin sidewalls 116 are about halfway between the top surface and bottom surface of the PMOS fin structures 111. As will be described in more detail below, the top surface of the etched fin sidewalls 116 may correspond with the bottom of the source/drain features that are formed in the PMOS fin structures 111.

Figure 1G:
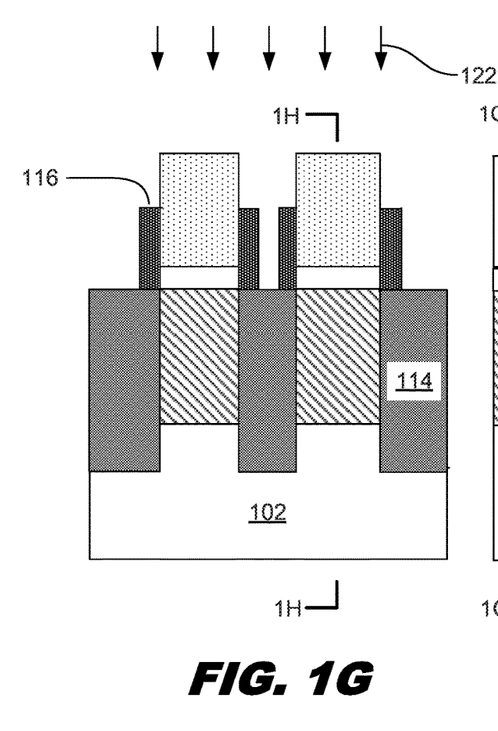

FIG. 1G is a diagram illustrating another doping process 122 to introduce dopants into the PMOS fin structures 111. The doping process 122 may be similar to the doping process 118 described above. In some examples, the doping process 118 may be performed and the doping process 122 may be omitted. In some examples, the doping process 118 may be omitted and the doping process 122 may be performed. In some examples, both the doping process 118 and the doping process 122 may be performed.

Figure 1H:
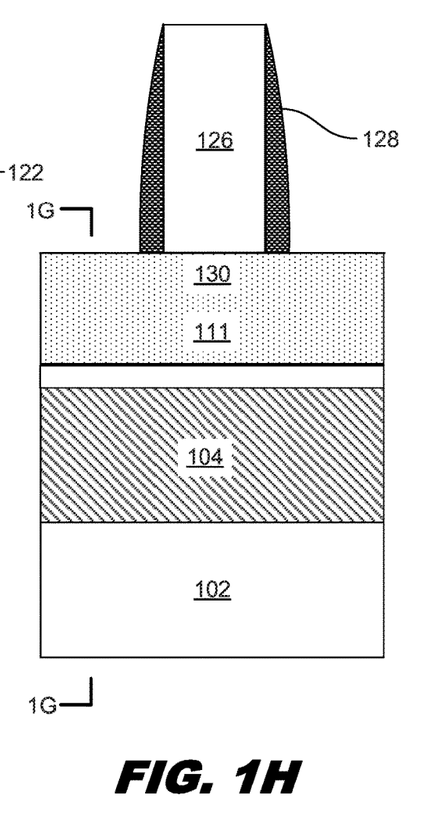

FIG. 1H illustrates a diagram of a semiconductor device along a view orthogonal to the view shown in FIGS. 1A-1G. Specifically, FIG. 1H illustrates a gate structure 126 having sidewalls 128 formed thereon for a transistor. The gate structure 126 may be formed before the fin sidewalls 116 are formed. The gate structure 126 may be formed in one of a variety of manners. In one example, a conductive material, such as polysilicon is deposited onto the substrate. The polysilicon layer is then patterned to create elongated gate structures 126 that wrap around the fin structures 111. After the gate structure is formed, and before source/drain regions are formed, the gate sidewalls 128 may be deposited onto the sidewalls of the gate structure. The gate sidewalls 128 may be a dielectric material.

Figure 1I:
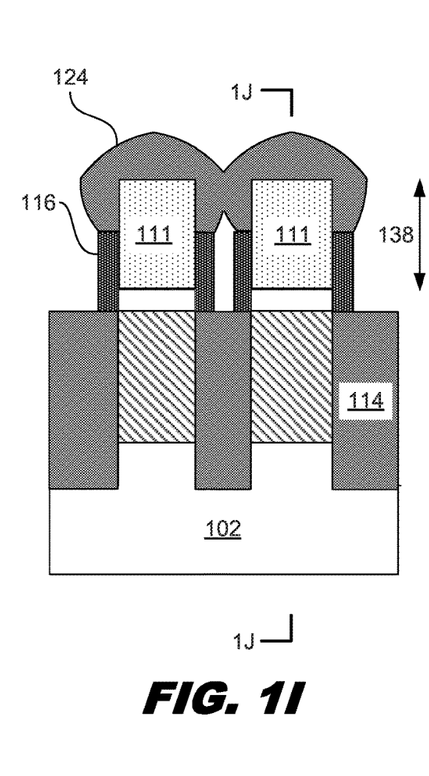
Figure 1J:
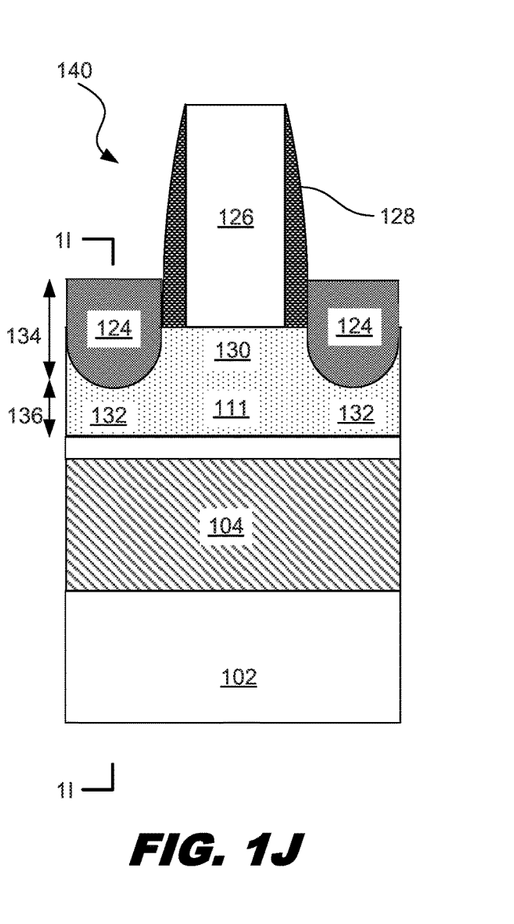

FIGS. 1I and 1J illustrate formation of source/drain regions 124 on both sides of the gate structure to form a transistor 140. FIG. 1I is a cross-section along the same cross-section illustrated in FIGS. 1A-1G. The channel region 130 is positioned underneath the gate structure 126 and between the source/drain regions 124.

The source/drain regions 124 may be formed by etching portions of the fin structure to create a cavity within the fin structures. The etching process may be designed so as to create the cavity at a specific depth within the fin structures 111. For example, and as illustrated, the cavity may have a depth that extends about halfway through the height of the fin structures 111. After the cavity is formed, an epitaxial growth process may be applied to epitaxially grow the source/drain regions 124 within the cavities. The source/ drain regions 124 may also be doped in situ. In other words, the source/drain regions 124 may be implanted with the desired dopant species while the source/drain regions 124 are being formed.

The source/drain regions 124 may include the same type of semiconductor material (e.g., silicon germanium) as the PMOS fin structure 111. In some examples, however, the source/drain regions may have a larger concentration of germanium than the PMOS fin structure 111. For example, the source/drain regions 124 may have a concentration of germanium within a range of 45-75 percent. Thus, the source/drain regions 124 may have a higher concentration of germanium than the channel region 130 and the under-region 132.

As illustrated in FIG. 1A, the source/drain 124 regions of adjacent fin structures 111 are merged. In some examples, however, there may be a gap between the source/drain regions 124 of adjacent fin structures 111. In other words, there may be no merging of source/drain regions between adjacent fin structures 111.

FIG. 1J illustrates the semiconductor device along a view orthogonal to the view shown in FIGS. 1A-1G. In other words, FIG. 1J has a similar cross-section to that shown in FIG. 1H. According to one example, the fin structure 111 may have a height 138 within a range of about 50-60 nanometers. The thickness 134 of the source/drain region 124 may be within a range of about 30-40 nanometers. Similarly, the thickness of 136 of the under-region 132 (i.e., the region underneath the source/drain regions 124) may be within a range of about 25-30 nanometers. In other words, the source/drain region 124 extends to a point that is about halfway between the top and bottom of the fin structure 111. Other heights and thicknesses of the fin structure 111, source/drain regions 124, and under-region 132 are contemplated.

In the present example, the lower portion of the fin structure 111 connects with the channel. This adds additional stress on the channel 130 and thus improves the carrier mobility through the channel 130. Additionally, the under-region 132 includes the dopant species that is used during the implantation process.

The semiconductor device illustrated in FIGS. 1A-1J are illustrated in a manner so as to convey the principles described herein, and do not necessarily represent the dimensions of a real semiconductor device that is fabricated using such principles. For example, while the fin structures are illustrated as substantially rectangular, it is understood by one of ordinary skill in the art that real fin structures may not necessarily be perfectly rectangular. For example, real fin structures may include rounded corners and slightly non-linear surfaces. Additionally, real fin structures may taper towards a top side of the fin structure.

Figure 2:
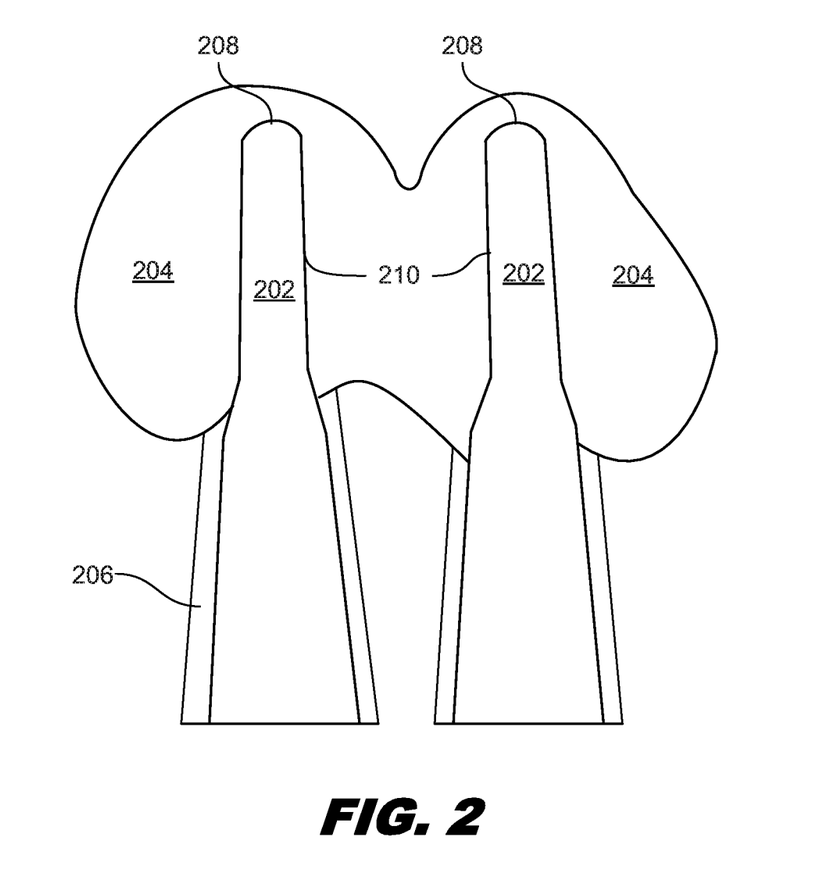
FIG. 2 is a diagram showing various characteristics of an improved PMOS FinFET device, according to one example of principles described herein.

FIG. 2 is a diagram showing various characteristics of an improved PMOS FinFET device. FIG. 2 illustrates two fin structures 202. The fin structures 202 may be similar to the fin structures 111 described above. The fin structures 202 have a fin sidewall 206 extending from a bottom of the fin structures to a point that is about halfway through the height of the fin structures 202. The fin sidewalls 206 may be similar to the fin sidewalls 116 described above. Additionally, the source/drain features 204 may extend from the top surfaces of the fin sidewalls 206 to a point above the top surfaces 208 of the fin structures. Additionally, the side surfaces 210 of the fin structures 202 may taper inward towards the top of the fin structures. Additionally, the top surfaces 208 of the fin structures 202 may be rounded.

Figure 3:
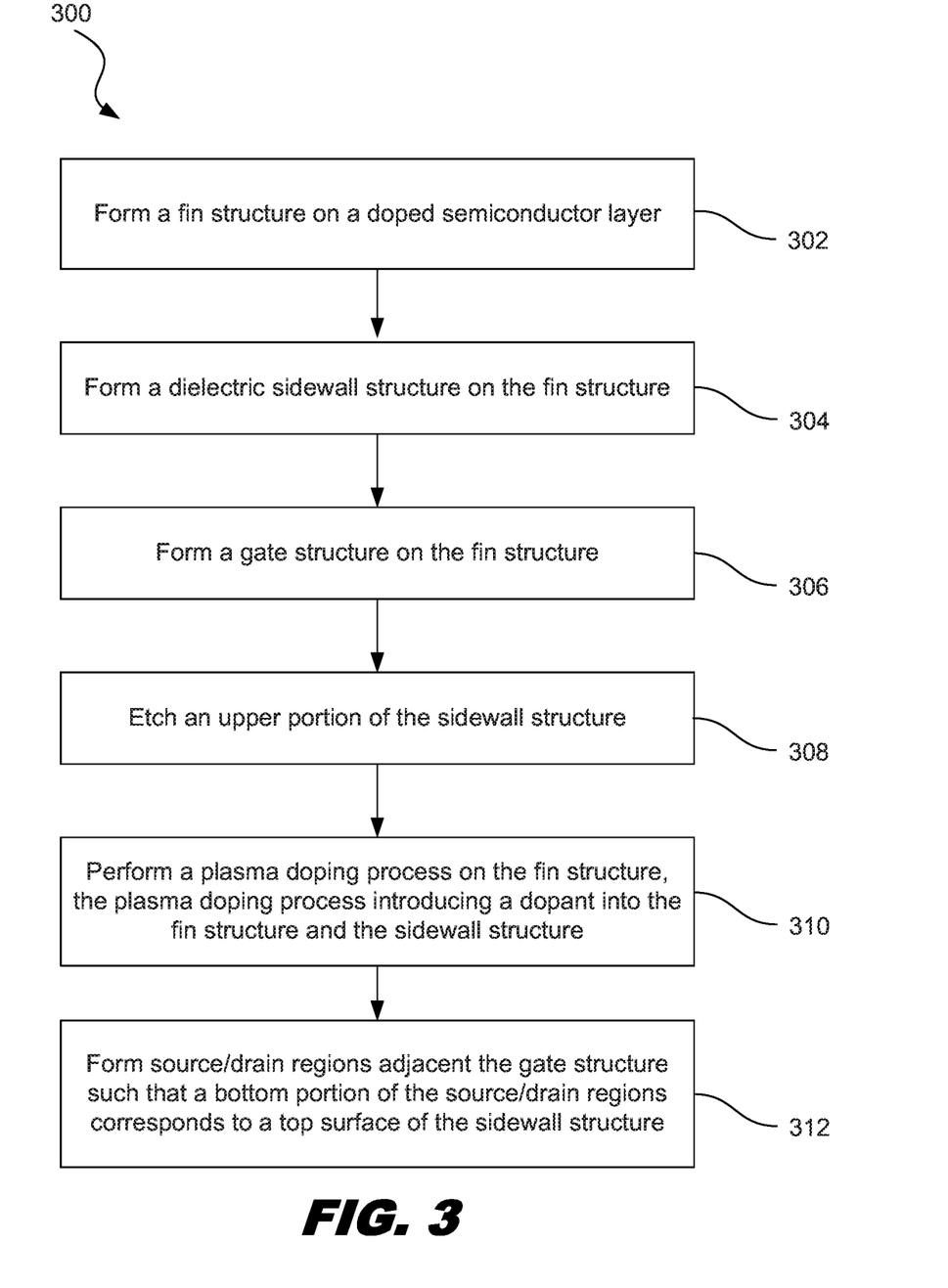
FIG. 3 is a flowchart showing an illustrative method for forming an improved PMOS FinFET device, according to one example of principles described herein.

FIG. 3 is a flowchart showing an illustrative method for forming an improved PMOS FinFET device. According to one example, the method 300 includes a process 302 for forming a fin structure 111 on a doped semiconductor layer 104. The doped semiconductor layer 104 may be an n-well doped with n-type dopants. The fin structure 111 may include a semiconductor material such as silicon germanium. In one example, the fin structure 111 may be formed by epitaxially growing a layer of silicon germanium and patterning that silicon germanium to form the fin structures 111

In some examples, the substrate 102 may be a semiconductor wafer comprising silicon. The semiconductor wafer may be a standard wafer used in semiconductor fabrication processes. For example, the semiconductor wafer may be a round wafer having a diameter of about 300 millimeters. The n-well 104 and a p-well 106 may be formed by doping the semiconductor with the appropriate type of dopant. For example, to form the n-well 104, the portions of the semiconductor substrate 102 that are to be p-wells 106 are covered by a mask such as an oxide material. Then, a doping process such as an implanting process can be applied to the exposed portions of the semiconductor substrate 102. The n-well 104 may be doped with an n-type dopant such as Arsenic.

After the n-well regions 104 are formed, the n-well regions 104 may be covered with a mask material that is then patterned to expose the portions of the substrate where the p-wells 106 are to be formed. Then, a doping process such as an implanting process may be used to dope the exposed portions of the semiconductor substrate with a p-type dopant such as boron. In some examples, the p-wells 106 may be formed before the n-wells 104. The semiconductor layer for the PMOS devices may then be formed by use of an epitaxial growth process. An epitaxial growth process is one in which semiconductor material is provided through a carrier gas and is deposited into a crystal structure onto the underlying crystal substrate. Thus, the semiconductor layer gets deposited onto the semiconductor n-wells and p-wells. In one example, the semiconductor layer may be silicon. The semiconductor layer may be selected for use as a fin structure for an NMOS device. Thus, the semiconductor layer may also be referred to as an NMOS semiconductor layer.

After the PMOS semiconductor layer is formed, the NMOS semiconductor layer, which will be patterned to form the fin structures 111, may be formed. Specifically, the portions of the PMOS semiconductor layer over the n-wells 104 may be removed and replaced with a semiconductor layer selected for use in the fin structure 111 of a PMOS device.

To form the PMOS semiconductor layer, the portions of the NMOS semiconductor layer that are over the p-wells are covered with a mask layer. The mask layer is patterned to expose the regions over the n-wells. Then an etching process is applied to remove the semiconductor layer that is exposed through the mask. In some examples, and as illustrated, the semiconductor layer is not entirely removed. Instead, a small, thin layer is left remaining to be a seed layer. The seed layer may reduce the number of defects that are present in the PMOS semiconductor layer. The PMOS semiconductor layer may be formed through an epitaxial growth process. In some examples, a Chemical Mechanical Planarization (CMP) process may be used to planarize the top surface of the PMOS semiconductor layer 112 and the NMOS semiconductor layer 108. A CMP process includes a mechanical component and a chemical component. The mechanical component involves abrasive particles and the chemical component involves a chemical etchant. In one example, the PMOS semiconductor layer may include silicon germanium (SiGe). Other types of semiconductor materials that are well-suited for PMOS transistors may be used. The silicon germanium may have a concentration of germanium within a range of about 25 to 40%.

To form the fin structures 111, the substrate is patterned using photolithographic techniques. For example, a photoresist material may be deposited and patterned. Patterning the photoresist may be done by exposing the deposited photoresist to a light source through a mask. The photoresist layer may then be developed to expose regions that are to be etched. An etching process is then applied to remove portions of the substrate to form the fin structures as shown. After the fin structures 111 are formed, STI structures may be formed between the fin structures 111. This may be done by depositing a dielectric material and etching that material to the desired height. The dielectric material and the material of the fin structures may be selected so that the dielectric material of the structures can be removed while leaving the fin structures substantially intact.

The method 300 includes a process 304 for forming a dielectric sidewall structure on the fin structure. The fin sidewall 116 may be deposited through use of a deposition process such as a Chemical Vapor Deposition (CVD) process. Other deposition processes may be used to deposit the fin sidewall 116. The fin sidewall 116 may include a dielectric material such as a nitride material.

The method 300 further includes a process 306 for forming a gate structure on the fin structure. In some examples, the gate structure may be formed before the dielectric sidewall structure is formed. The gate structure 126 may be formed in one of a variety of manners. In one example, a conductive material, such as polysilicon is deposited onto the substrate. The polysilicon layer is then patterned to create elongated gate structures 126 that wrap around the fin structures 111. After the gate structure is formed, and before the source/drain regions 124 are formed, the gate sidewalls 128 may be deposited onto the sidewalls of the gate structure. The gate sidewalls 128 may be a dielectric material.

The method 300 further includes a process 308 for etching an upper portion of the sidewall structure. The etching process may be an anisotropic process such as a dry etching process. A dry etching process involves directing ions at a substrate to remove material from that substrate. A dry etching process can be selective so as to remove some type of materials while leaving other types of materials substantially intact. Thus, the etching process 120 can remove the fin sidewalls 116 while leaving the PMOS fin structures 111 substantially intact. The etching process 120 may be applied until the top surfaces of the fin sidewalls are at a point that is within the middle of the height of the fin structures 111. In some examples, the etching process 120 may be applied until the top surfaces of the fin sidewalls 116 are about halfway between the top surface and bottom surface of the PMOS fin structures 111.

The method 300 further includes a process 310 for performing a plasma doping process on the fin structure, the plasma doping process introducing a dopant into the fin structure and the sidewall structure. The plasma doping process may be applied before etching the upper portion of the sidewall structure, after etching the upper portion of the sidewall structure, or both. The doping process 118 also introduces the p-type dopant into the fin sidewall 116. A plasma doping process involves using a high voltage direct current (DC) to extract ions from plasma and inject them into a target. For example, a plasma gas may include p-type dopants such as boron. Such a plasma gas may then be introduced into a chamber that also includes the substrate. An electromagnetic field can then be applied to direct ions from the plasma into the surface.

The method 300 further includes a step 312 for forming source/drain regions adjacent the gate structure such that a bottom portion of the source/drain regions corresponds to a top surface of the sidewall structure. The source/drain regions 124 may be formed by etching portions of the fin structure to create a cavity within the fin structures. The etching process may be designed so as to create the cavity at a specific depth within the fin structures 111. For example, and as illustrated, the cavity may have a depth that extends about halfway through the height of the fin structures 111. After the cavity is formed, an epitaxial growth process may be applied to epitaxially grow the source/drain regions 124 within the cavities. The source/drain regions 124 may also be doped in situ. In other words, the source/drain regions 124 may be implanted with the desired dopant species while the source/drain regions 124 are being formed.

The source/drain regions 124 may include the same type of semiconductor material (e.g., silicon germanium) as the PMOS fin structure 111. In some examples, however, the source/drain regions may have a larger concentration of germanium than the PMOS fin structure 111. For example, the source/drain regions 124 may have a concentration of germanium within a range of 45-75 percent. Thus, the source/drain regions 124 may have a higher concentration of germanium than the channel region 130 and the under-region 132. In some example, a concentration of germanium within a channel region of the fin structure is within a range of 25-40 percent.

In some examples, a concentration of germanium within the source/drain region is greater than a concentration of germanium within a channel region. In some examples, the lower portion of the fin structure below the source/drain region includes the p-type dopant at a lower concentration than the source/drain region. Thus, if the p-type dopant is boron, then the fin structure below the source/drain region will have a lower concentration of boron than the concentration of boron within the source/drain regions. In some examples, a bottom of the source/drain region is positioned at about a halfway point between the top and bottom of the fin structure.

According to one example, a semiconductor device includes a doped semiconductor layer and a fin structure disposed on the doped semiconductor layer, the fin structure being doped with a p-type dopant. The semiconductor device further includes a source/drain portion disposed within an upper portion of the fin structure and a fin side wall formed along a lower portion of the fin structure, the fin sidewall having the p-type dopant.

According to one example, a semiconductor device includes a fin structure having an upper portion and a lower portion and a source/drain region formed within the upper portion, the source/drain region comprising a p-type dopant having a first concentration. The semiconductor device further includes an under-region positioned within the lower portion and aligned with the source/drain region, the under-region comprising the p-type dopant at a second concentration that is less than the first concentration. The semiconductor device further includes a fin sidewall formed along the lower portion of the fin structure.

According to one example, a method includes forming a fin structure on a doped semiconductor layer, forming a dielectric sidewall structure on the fin structure, forming a gate structure on the fin structure, etching an upper portion of the sidewall structure, performing a plasma doping process on the fin structure, the plasma doping process introducing a dopant into the fin structure and the sidewall structure, and forming source/drain regions adjacent the gate structure such that a bottom portion of the source/drain regions corresponds to a top surface of the sidewall structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a doped semiconductor layer;
   a fin structure disposed on the doped semiconductor layer, the fin structure being doped with a p-type dopant;
   a source/drain region disposed within an upper portion of the fin structure; and
   a dielectric fin sidewall formed along a lower portion of the fin structure, the dielectric fin sidewall having the p-type dopant;
   wherein a bottom surface of the source/drain region contacts a top surface of the dielectric fin sidewall.

2. The semiconductor device of claim 1, wherein the doped semiconductor layer comprises an n-well.

3. The semiconductor device of claim 1, wherein the fin structure comprises silicon germanium.

4. The semiconductor device of claim 1, wherein a concentration of germanium within the source/drain region is greater than a concentration of germanium within a channel region.

5. The semiconductor device of claim 1, wherein the lower portion of the fin structure below the source/drain region comprises the p-type dopant at a lower concentration than the source/drain region.

6. The semiconductor device of claim 1, wherein the p-type dopant comprises boron.

7. The semiconductor device of claim 1, further comprising a gate structure formed on the fin structure adjacent the source/drain region.

8. The semiconductor device of claim 1, wherein a bottom of the source/drain region is positioned at about a halfway point between a top and a bottom of the fin structure.

9. The semiconductor device of claim 1, wherein a concentration of germanium within the source/drain region is within a range of about 45-75 percent.

10. A semiconductor device comprising:
    a substrate;
    a fin structure on the substrate, the fin structure having an upper portion and a lower portion;
    a source/drain region formed within the upper portion, the source/drain region comprising a p-type dopant having a first concentration;
    an under-region positioned within the lower portion and aligned with the source/drain region, the under-region comprising the p-type dopant at a second concentration that is less than the first concentration; and
    a fin sidewall layer formed along the lower portion of the fin structure and extending from the substrate to a bottom surface of the source/drain region.

11. The semiconductor device of claim 10, wherein a height of the fin structure is within a range of about 50-60 nanometers.

12. The semiconductor device of claim 10, wherein a height of the fin sidewall layer is within a range of about 5-20 nanometers.

13. The semiconductor device of claim 10, wherein a concentration of germanium within a channel region of the fin structure is within a range of 25-40 percent.

14. The semiconductor device of claim 10, wherein a concentration of germanium within the source/drain region is within a range of about 45-75 percent.

15. The semiconductor device of claim 10, wherein a concentration of the p-type dopant within the source/drain region is within a range of about $3 \times 10^{20}$-$7 \times 10^{20}$.

16. The semiconductor device of claim 10, wherein the fin structure is disposed on an n-well.

17. The semiconductor device of claim 10, wherein the sidewall layer includes the p-type dopant.

18. A semiconductor device comprising:
    a doped semiconductor layer;
    a fin structure disposed on the doped semiconductor layer, the fin structure comprising a doped silicon germanium (SiGe) region;
    a dielectric sidewall structure disposed on the fin structure adjacent a lower portion of the doped SiGe region;
    a gate structure disposed on the fin structure;
    doped SiGe source/drain regions disposed such that a bottom-facing surface of the source/drain regions directly contacts an upper-facing surface of the fin structure doped SiGe region.

19. The semiconductor device of claim 18, wherein the dopant is a p-type dopant.

20. The semiconductor device of claim 18, wherein a concentration of germanium within the source/drain region is within a range of about 45-75 percent.

* * * * *